US007950928B2

(12) United States Patent
Szu

(10) Patent No.: US 7,950,928 B2
(45) Date of Patent: May 31, 2011

(54) ELECTRICAL CONNECTOR AND ASSEMBLY THEREOF

(75) Inventor: Ming-Lun Szu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/778,141

(22) Filed: May 12, 2010

(65) Prior Publication Data

US 2010/0291775 A1 Nov. 18, 2010

(30) Foreign Application Priority Data

May 12, 2009 (TW) ............................... 98208101 U

(51) Int. Cl.
*H01R 12/00* (2006.01)
*H05K 1/00* (2006.01)

(52) U.S. Cl. ......................................................... 439/70

(58) Field of Classification Search .................... 439/70, 439/66, 65, 71
See application file for complete search history.

(56) References Cited

U.S. PATENT DOCUMENTS 3,487,350 A * 12/1969 Hammell ........................ 439/70
6,843,659 B2 * 1/2005 Liao et al. ....................... 439/66
6,957,987 B2 * 10/2005 Ma et al. .................... 439/733.1

* cited by examiner

*Primary Examiner* — Javaid Nasri
(74) *Attorney, Agent, or Firm* — Andrew C. Cheng; Wei Te Chung; Ming Chieh Chang

(57) ABSTRACT

An electrical connector assembly includes an electrical connector, an IC seated on connector and a PCB. The electrical connector includes an insulative housing and a number of electrical contacts each having a retaining portion secured to the housing, a main portion connecting with the retaining portion and a contact portion. The contact portion has a pair of first contacting sections electrical connected with the PCB and a pair of second contacting sections contacting with the IC, and the first and second contacting sections of the electrical contact are disposed in passageways on the PCB.

20 Claims, 6 Drawing Sheets

ELECTRICAL CONNECTOR AND ASSEMBLY THEREOF

BACKGROUND OF THE INVENTION

1. Field of the Invention

The present invention relates to an electrical connector and assembly thereof, and more particularly, to an electrical connector for establishing electrical connection between an IC (Integrated Circuit) and a PCB (Printed Circuit Board).

2. Description of Related Art

Generally, electrical connection between IC (Integrated Circuit) and PCB (Printed Circuit Board) are achieved by electrical connectors. The electrical connector includes an insulative housing and a plurality of electrical contacts received in the insulative housing. Each of the contacts has a retention section received in the insulative housing, a contact portion for contacting with the IC, and a solder portion soldering to the PCB. When the IC is inserted into the insulative housing, pins of the IC contact with the electrical contacts and tip ends of the pins are located into the insulative housing. In this case, the height of the electrical connector is larger than the pins of the IC. Even designers try to decrease the height of the electrical connector; it still can not achieve a satisfying result under this condition.

Therefore, it is needed to provide an improved electrical connector to overcome the disadvantages mentioned above.

BRIEF SUMMARY OF THE INVENTION

An object of the present invention is to provide a low profile configuration between an IC and a PCB with an improved electrical connector.

An electrical connector for electrical connected an IC (Integrated Circuit) and a PCB (Printed Circuit Board) comprises an insulative housing and a plurality of electrical contacts secured to the insulative housing. The insulative housing includes a plurality of through holes and a plurality of slots corresponding to the through holes, respectively. The electrical contact comprises a main portion, a retaining portion connecting with the main portion and engaging with the slots of the insulative housing, and a contact portion extending from the main portion. The contact portion are located under a lower face of the insulative housing and defines at least one first contacting point for contacting with the PCB and at least one second contacting point for contacting with the IC.

An electrical connector assembly comprises an electrical connector, a PCB (Printed Circuit Board) and an IC (Integrated Circuit). The electrical connector includes an insulative housing and a plurality of electrical contacts. Each of the electrical contacts comprises a retaining portion secured to the insulative housing, a main portion connecting with the retaining portion and a contact portion extending from the main portion. The PCB comprises a plurality of passageways corresponding to the electrical contacts, respectively. Each of the contact portions comprises at least one first contacting section electrical connected with the PCB and at least one second contacting section contacting with the IC, and the first and second contacting sections of the electrical contact are disposed in the passageway of the PCB.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
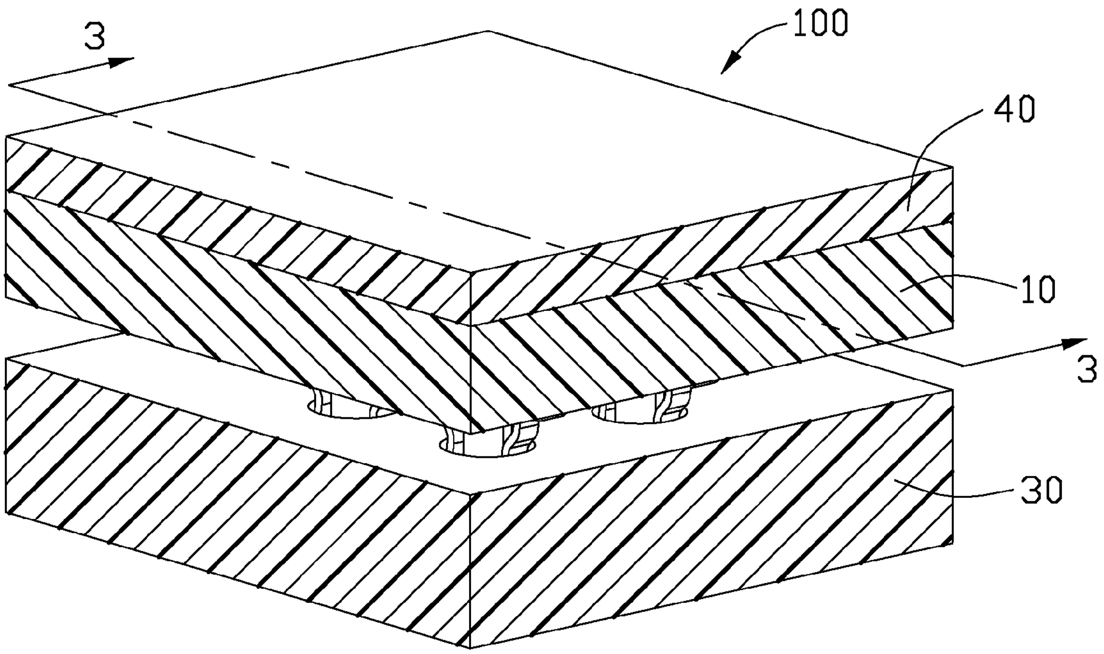
FIG. 1 is an assembled, perspective view of an electrical connector assembly according to a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
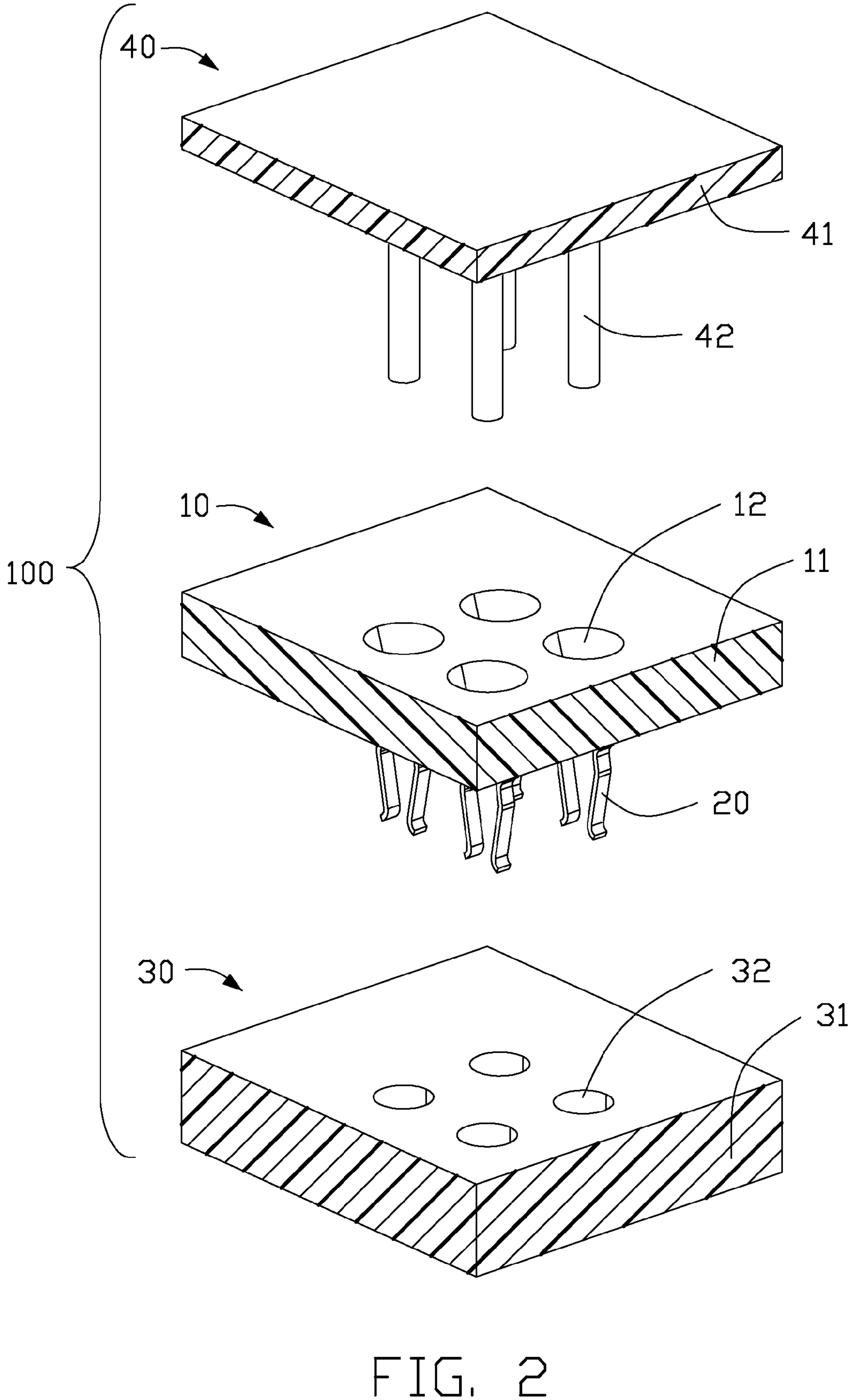
FIG. 2 is an exploded, perspective view of an electrical connector assembly.
Figure 3:
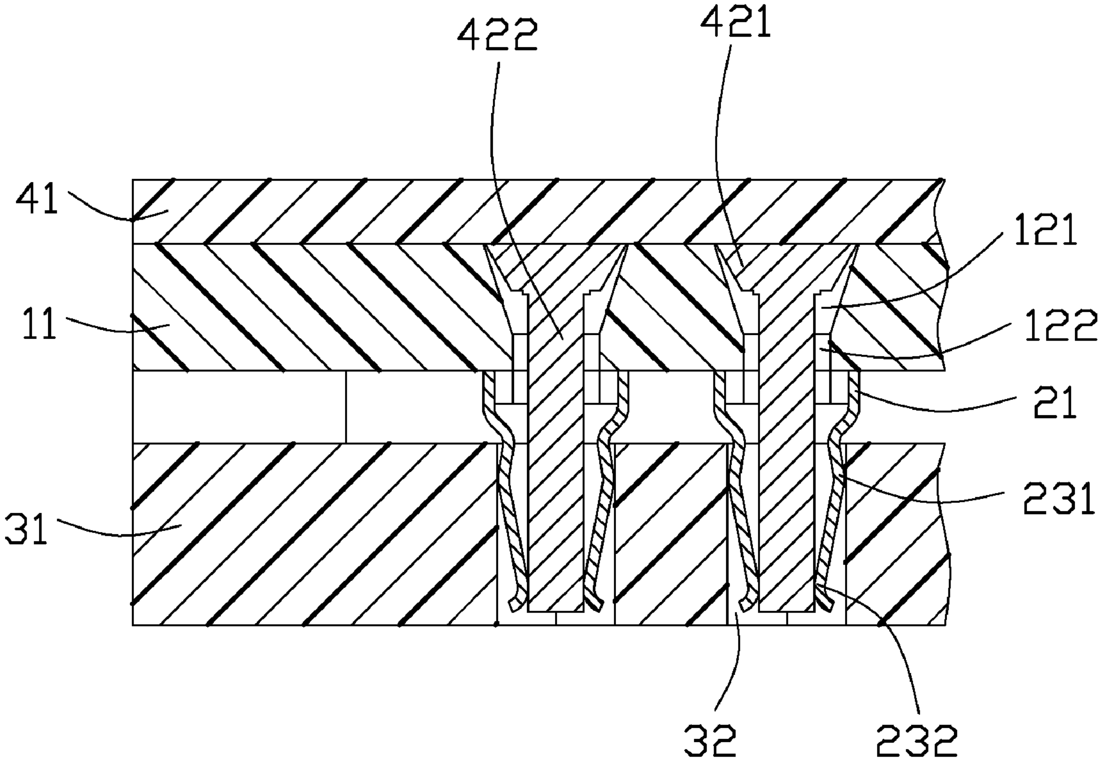
FIG. 3 is a cross sectional view of the electrical connector assembly taken along the line 3-3 of FIG. 1.

Please referring to FIGS. 1-3, an electrical connector assembly 100 according to a preferred embodiment of the present invention includes an electrical connector 10, an IC (Integrated Circuit) 40 seated on the electrical connector 10, and a PCB (Printed Circuit Board) 30 on which the electrical connector 10 is mounted. The PCB 30 includes a base plate 31 and a plurality of passageways 32 formed therein. The IC 40 comprises a substrate 41 and a plurality of pins 42 electrical and mechanically connected with the substrate 41. The pins 42 each has a bigger taper portion 421 connected with the substrate 41 and a smaller column portion 422 extending downwardly from the tape portion 421.

Figure 4:
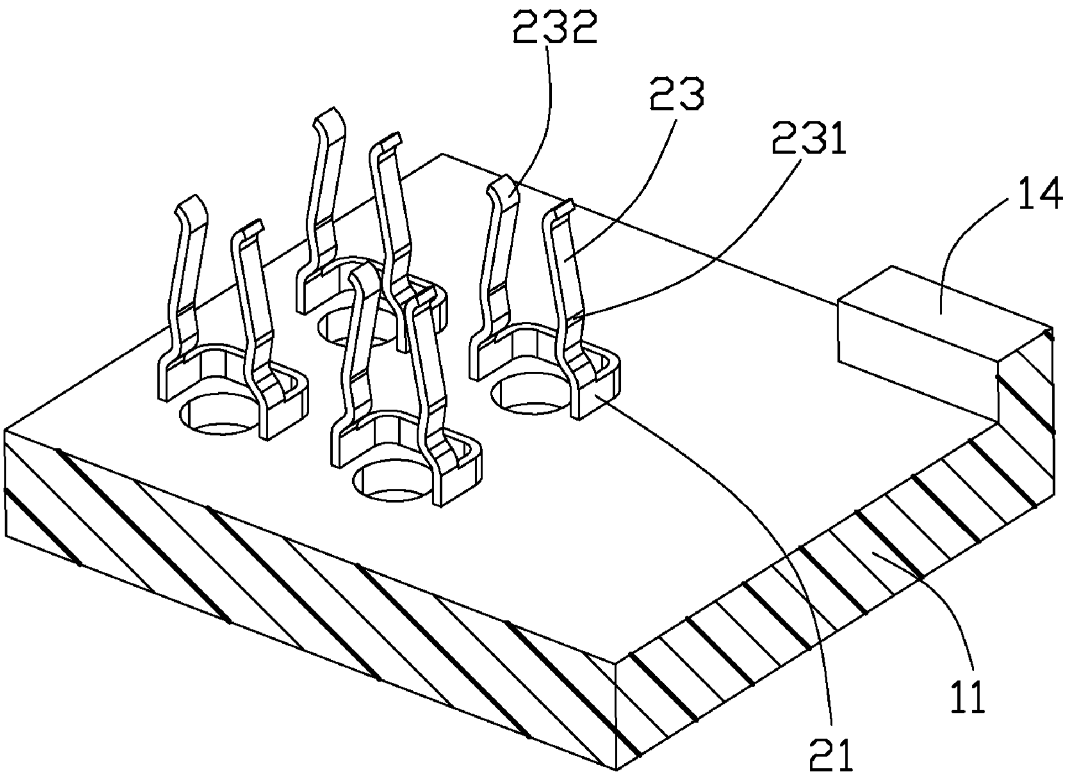
FIG. 4 is an assembled, perspective view of the electrical connector shown in FIG. 1.
Figure 5:
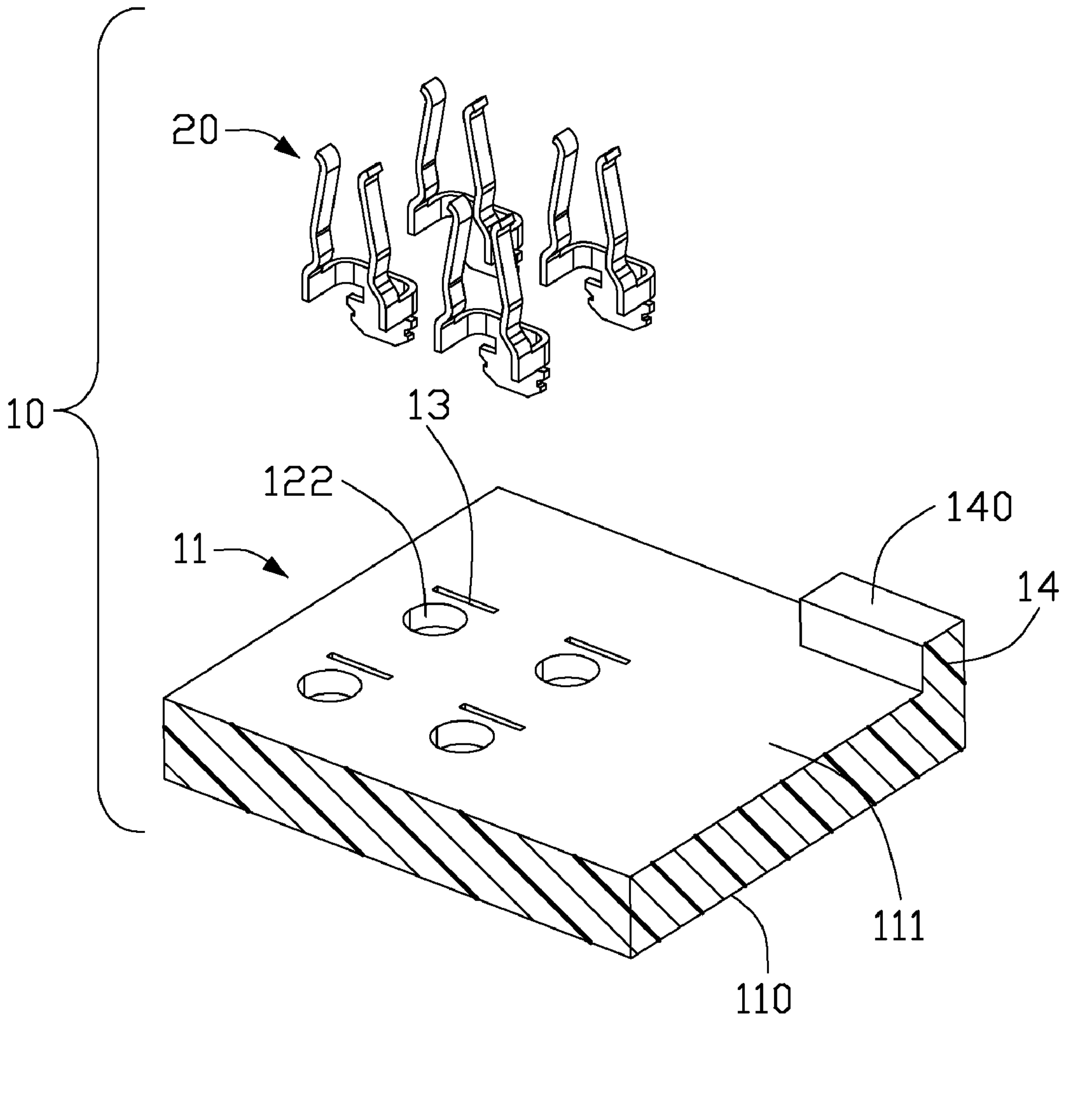
FIG. 5 is an exploded, perspective view of the electrical connector.
Figure 6:
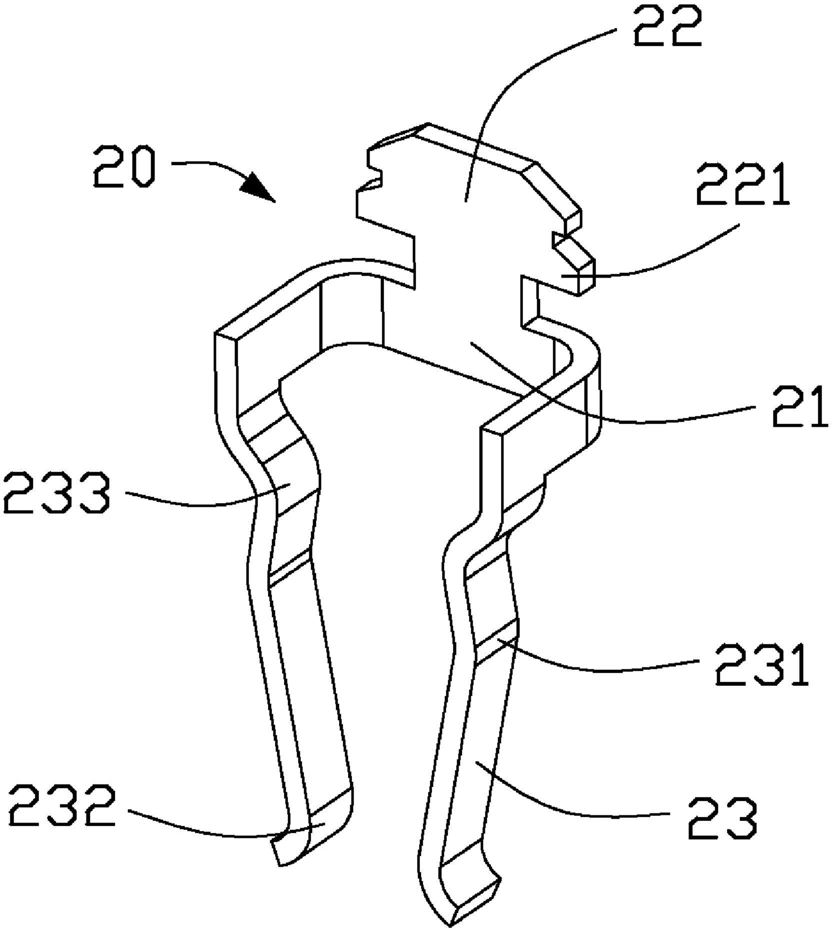
FIG. 6 is an assembled, perspective view of the electrical contact of the present invention.

Please referring to FIGS. 4-6, the electrical connector 10 comprises an insulative housing 11 and a plurality of electrical contacts 20 attached to the insulative housing 11. The insulative housing 11 has an upper face 110 and a lower face 111 with a plurality of through holes 12 extending from the upper face 110 to the lower face 111. A plurality of slots 13 are defined on the lower face 111 and corresponding to the through holes 12, respectively. The through holes 12 each includes a taper guiding hole 121 and a column receiving hole 122 communicated with each other and both separated from the corresponding slot 13. A plurality of stand-offs 14 projects downwardly from the lower face 111.

The electrical contact 20 has a U-shaped main portion 21, a retaining portion 22 extending upwardly from the main portion 21, and a contact portion extending downwardly from the main portion 21. The retaining portion 22 is received in the slots with barbs 221 engaging with inner face of the slot 13. The contact portion comprises a pair of contact arms 23 extending into the passageways 32 of the PCB 30.

Each contact arm 23 comprises a first bending point 231 protruding outwardly, a second bending point 232 protruding inwardly, and a third bending point 233 protruding inwardly. The second, first and third bending points 232, 231, 233 are arranged on the contact arm 23 from down to up. The first bending point 231 forms a first contacting point for mechanically and electrically connecting with the PCB 30 and the second bending point 232 forms a second contacting point for contacting with the-pins 42 of the IC 40. After the electrical contacts 20 assembled to the insulative housing 11, the main portion 21 and the contact portion are located under the lower face 111 of the insulative housing 11.

In assembling, first attach the electrical connector 10 to the PCB 30. The contact arms 23 of each electrical contact 20 are received in the passageways 32 of the PCB 30 with the first and second bending points 231, 232 disposed in the passageways 32. Although the third bending point 233 is on the top of the passageway 32, it also could be arranged in the passageway 32. Bottom surface 140 of the stand-off 14 contacts with the top face of the PCB 30 and the main portions 21 are located between the bottom surface 140 and the lower face 111 of the insulative housing 11. A distance between the pair of second bending points 232 is smaller than a distance between the pair of first bending points 231. Moreover, the third bending point 233 is located between the first and second bending points 231, 232 of the same contact arm 23 in a radial direction of the passageway 32.

Then, insert the IC 40 into the electrical connector 10. The column portion 422 passes through the guiding hole 121, the receiving hole 122, the main portion 21, and the contact arms 23 in turn until it contact with the second bending point 232. Finally, the column portion 422 is also disposed in the passageway 32 of the PCB 30. The taper portion 421 is received in the guiding hole 121 with the IC 40 seated on the electrical connector 10. Each pin 41 contacts with a pair of second bending points 232 whereby urge the contact arms 23 to expand outwardly and further make the first bending points 231 contact with the inner surface of the passageway 32 thereby establish electrical connection between the electrical connector 10 and the PCB 30. Since the contact arms 23 contact with the pins 42 of the IC 40 in the same time, the electrical connection between the PCB 30 and the IC 40 is also established.

The main portion 21 and contact portion are located outside of the insulative housing 11 and under the lower face 111 thereof which can reduce the height of the insulative housing 11. The contact arms 23 of the electrical contacts 20 project into the PCB 30 and form first and second contact points 231, 232 for the IC 40 and PCB 30 in the same time whereby the pins 42 of the IC 40 can pass through the insulative housing 11 and are disposed in the PCB 30 which also reduce the total height of electrical connector assembly 100. Furthermore, the second contact points 232 mechanically contacted with the PCB 30 rather than soldered to the PCB 30 also simplify the assembly process of the electrical connector assembly 100.

Although, the first and second bending points are protruded to opposite directions, they also could protrude in a same direction. In addition, the second bending points for contacting with the IC could be higher than the first bending points for contacting with the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector for electrical connected an IC (Integrated Circuit) and a PCB (Printed Circuit Board), comprising:

an insulative housing including a plurality of through holes and a plurality of slots corresponding to the through holes, respectively; and a plurality of electrical contacts secured to the insulative housing, the electrical contact comprising a main portion, a retaining portion connecting with the main portion and engaging with the slots of the insulative housing, and a contact portion extending from the main portion and having a pair of contact arms, the contact arms being located under a lower face of the insulative housing and each defining one first contacting point for contacting with the PCB and one second contacting point for contacting with the IC.

2. The electrical connector as claimed in claim 1, wherein the first contacting points is higher than the second contacting point.

3. The electrical connector as claimed in claim 1, wherein the first and the second contacting points are protruding in either opposite directions or a same direction.

4. The electrical connector as claimed in claim 1, wherein the contact arm further comprises a bending point located higher than the first and second contacting points, and wherein the bending point is located between the first and second contacting points in a radial direction of the through hole.

5. The electrical connector as claimed in claim 1, wherein a distance between a pair of second contacting points is smaller than a distance of a pair of first contacting points of each electrical contact.

6. The electrical connector as claimed in claim 1, wherein the insulative housing has a plurality of stand-offs protruding downwardly from the lower face thereof, and wherein the main portions are located between the lower surface and a bottom surface of the stand-offs.

7. The electrical connector as claimed in claim 1, wherein the through hole includes an upper taper hole and a lower column hole, and wherein the slots are separate from the through holes.

8. An electrical connector assembly, comprising:

an electrical connector including an insulative housing and a plurality of electrical contacts, each of the electrical contacts comprising a retaining portion secured to the insulative housing, a main portion connecting with the retaining portion and a contact portion extending from the main portion;

a PCB (Printed Circuit Board) comprises a plurality of passageways corresponding to the electrical contacts, respectively; and an IC (Integrated Circuit); wherein each of the contact portions comprises at least one first bending section electrical connected with the PCB and at least one second bending section contacting with the IC, and the first and second bending sections of the electrical contact are disposed in the passageway of the PCB, and the first bending section is higher than the second bending section.

9. The electrical connector assembly as described in claim 8, wherein the IC comprises a planar body and a plurality of pins secured to the planar body, and wherein said pins are projected into the passageways of the PCB.

10. The electrical connector assembly as described in claim 9, wherein the pins each comprises a taper portion connected with the planar body and a column portion located in the passageways of the PCB and contacting with the second bending section of the electrical contacts.

11. The electrical connector assembly as described in claim 9, wherein the first bending sections are mechanically and electrically connected with the inner surface of the passageways in the PCB.

12. The electrical connector assembly as described in claim 8, wherein the first and the second bending sections are protruding in opposite directions.

13. The electrical connector assembly as claimed in claim 8, wherein the contact portion has a pair of contact arms and one first bending section and one second bending section both are located on each contact arm, and wherein the first bending section forms a first contacting point and the second bending section forms a second contacting point, and wherein a distance between a pair of second contacting points is smaller than a distance of a pair of first contacting points of each electrical contact.

14. An connector assembly for use with an electronic package having a plurality of pins, comprising:

an insulative housing defining opposite first and second surfaces with a plurality of first holes extending therethrough in a vertical direction;

a plurality of contacts located upon the second surface in alignment with the corresponding first holes, respectively, in said vertical direction, each of said contacts defining a retaining section secured to the housing and a resilient contacting section extending away from the housing; and a printed circuit board communicatively spaced from the housing in a parallel relation and defining a plurality of second holes in alignment with the corresponding first holes, respectively, in the vertical direction; wherein the contacting sections of the contacts extend toward the corresponding second holes, respectively, for establishing electrical connection between the contacts and the printed circuit board; wherein a height of the housing is small enough for allowing the pins of the electronic package to extend into the corresponding second holes, respectively; wherein insertion of the pin into the corresponding second hole not only mechanically and electrically connects to the corresponding contact but also deflects the corresponding contact to enhance engagement between the corresponding contact and the printed circuit board.

15. The connector assembly as claimed in claim 14, wherein each of the second holes is dimensioned to be large enough so as to have the contacting section of the corresponding contact received therein to be deflected when said electronic package is seated upon the first surface of the housing and each of the pins extends through the corresponding first hole and mechanically and electrically contacts the contacting section of the corresponding contact, thus establishing electrical connection between the electronic package and the printed circuit board.

16. The connector assembly as claimed in claim 15, wherein the contacting section of each of said contacts is not soldered to the printed circuit board but simultaneously contacts both the printed circuit board and the corresponding pin of the electronic package.

17. The connector assembly as claimed in claim 16, wherein in each of said second holes, a contact point between the contacting section and the corresponding pin of the electronic package is farther from the housing than another contact point between the contacting section and the printed circuit board.

18. The connector assembly as claimed in claim 14, wherein each of said contacts includes a main body located in a space between the housing and the printed circuit board, from which the retaining section extends toward the housing and the contacting section extends toward the printed circuit board.

19. The connector assembly as claimed in claim 14, wherein disregarding whether the electronic package is assembled to the housing, said contacting sections are constantly engaged within the corresponding second holes, respectively, for establishing constant electrical connection between the contacts and the printed circuit board.

20. The connector assembly as claimed in claim 14, wherein the retaining section of the contact is located spaced from while adjacent to the corresponding first hole.

* * * * *